(12) United States Patent
Yang et al.

(10) Patent No.: US 9,236,539 B2
(45) Date of Patent: Jan. 12, 2016

(54) LIGHT EMITTING DIODE PACKAGE AND MANUFACTURING METHOD THEREOF

(71) Applicant: Samsung Display Co., Ltd., Yongin, Gyeonggi-Do (KR)

(72) Inventors: Jung-Hyun Yang, Seoul (KR); Myung-Seok Kwon, Seongnam-si (KR); Young-Min Park, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 155 days.

(21) Appl. No.: 13/846,658

(22) Filed: Mar. 18, 2013

(65) Prior Publication Data

US 2014/0159085 A1  Jun. 12, 2014

(30) Foreign Application Priority Data

Dec. 10, 2012 (KR) .................. 10-2012-0142970

(51) Int. Cl.
  *H01L 31/12* (2006.01)
  *H01L 27/15* (2006.01)
  *H01L 33/58* (2010.01)
  *H01L 33/50* (2010.01)

(52) U.S. Cl.
  CPC ............... *H01L 33/58* (2013.01); *H01L 33/502* (2013.01); *H01L 2933/0058* (2013.01)

(58) Field of Classification Search
  CPC ......... H01L 31/12; H01L 27/32; H01L 33/00; H01L 33/08; H01L 27/15; H01L 51/50
  USPC .......................................................... 257/80
  See application file for complete search history.

(56) References Cited

U.S. PATENT DOCUMENTS

| 8,168,997 | B2 | 5/2012 | Joo et al. | |
| 2005/0161771 | A1* | 7/2005 | Suehiro et al. | 257/612 |
| 2006/0239037 | A1 | 10/2006 | Repetto et al. | |
| 2007/0120135 | A1* | 5/2007 | Soules et al. | 257/98 |
| 2007/0267965 | A1* | 11/2007 | Igarashi et al. | 313/501 |
| 2008/0048200 | A1* | 2/2008 | Mueller et al. | 257/98 |
| 2009/0256166 | A1* | 10/2009 | Koike et al. | 257/98 |
| 2010/0148196 | A1* | 6/2010 | Kamada et al. | 257/98 |
| 2010/0230693 | A1* | 9/2010 | Tran | 257/98 |
| 2011/0195543 | A1 | 8/2011 | Jadhav et al. | |
| 2011/0234938 | A1 | 9/2011 | Jeong et al. | |
| 2012/0080783 | A1 | 4/2012 | Hsieh et al. | |

FOREIGN PATENT DOCUMENTS

| KR | 10-0746632 | 7/2007 |
| KR | 10-2009-0048927 | 5/2009 |
| KR | 10-2009-0064717 | 6/2009 |
| KR | 10-2010-0021891 | 2/2010 |
| KR | 10-2011-0049082 | 5/2011 |
| KR | 10-2012-0011185 | 2/2012 |
| KR | 10-2012-0013024 | 2/2012 |

* cited by examiner

*Primary Examiner* — Mohammad Choudhry
(74) *Attorney, Agent, or Firm* — Innovation Counsel LLP

(57) ABSTRACT

A light emitting package includes a circuit board, a light emitting chip disposed on the circuit board and electrically connected to the circuit board, a resin layer disposed on the light emitting chip, and a fluorescent layer disposed on the resin layer. The light emitting chip is disposed between the resin layer and the circuit board. The resin layer is disposed between the light emitting chip and the fluorescent layer. For a light, a refractive index of the resin layer is smaller than a refractive index of the light emitting chip and is larger than a refractive of the fluorescent layer.

8 Claims, 15 Drawing Sheets

210

120  110

LIGHT EMITTING DIODE PACKAGE AND MANUFACTURING METHOD THEREOF

CROSS-REFERENCE TO RELATED APPLICATION

This application claims priority to and the benefit of Korean Patent Application No. 10-2012-0142970 filed in the Korean Intellectual Property Office on Dec. 10, 2012, the entire contents of which are incorporated herein by reference.

BACKGROUND (a) Technical Field

The present invention relates to a light emitting package and a manufacturing method thereof. In particular, the present invention relates to a chip on board (COB) light emitting package and a manufacturing method thereof.

(b) Description of the Related Art

A light emitting diode (LED) package typically includes a light emitting source, such as a light emitting diode (LED) chip, and a phosphor material configured to convert light emitted from the light emitting source into a desired color. In general, a chip on board (COB) light emitting diode (LED) package may have excellent radiation characteristics.

FIG. 15 illustrates a conventional COB LED package that includes a plurality of conventional chip on board (COB) light emitting diode (LED) units 20. Each COB LED unit 20 may include an LED chip 12 mounted on a circuit board 110, a partition 13 surrounding the LED chip, and a phosphor material 14 deposited over the LED chip 12 in the region defined by the partition 13. If the thickness of the phosphor material 14 of an LED unit 20 is incorrect, the color (and/or brightness) of the light emitted from this defective LED unit 20 may be substantially different from the desired color (and/or brightness) of the light emitted from good LED units 20 of the same COB LED board.

Typically, it may be difficult to partially repair the COB LED board by repairing or replacing only the defective LED unit 20. As a result, the whole COB LED circuit board may be discarded, and the good LED units 20 may be wasted.

The above information disclosed in this Background section is for enhancement of understanding of the background of the invention. The Background section may contain information that does not belong to the prior art.

SUMMARY

One or more embodiments of the present invention may be related to a light emitting package that includes a circuit board, a light emitting chip disposed on the circuit board and electrically connected to the circuit board, a resin layer disposed on the light emitting chip, and a fluorescent layer disposed on the resin layer. The light emitting chip is disposed between the resin layer and the circuit board. The resin layer is disposed between the light emitting chip and the fluorescent layer. For a light, a refractive index of the resin layer is smaller than a refractive index of the light emitting chip and is larger than a refractive of the fluorescent layer. The intermediate refractive index of the resin layer in the refractive index arrangement may prevent significant difference(s) between refractive indexes of immediately neighboring light-transmitting media. Advantageously, light-transmitting efficiency may be maximized. The quality of the fluorescent layer may be tested before the fluorescent layer is disposed on the resin layer. Advantageously, potential defects of the light emitting package related to the quality of the fluorescent layer may be minimized or prevented.

In one or more embodiments, the fluorescent layer includes a fluorescent substance layer and a transparent partition, and the transparent partition surrounds both the fluorescent substance layer and the resin layer.

In one or more embodiments, the fluorescent substance layer has a recess, and the light emitting chip is disposed inside the recess.

In one or more embodiments, a first surface of the resin layer contacts the light emitting chip, and a second surface of the resin layer overlaps the light emitting chip and protrudes toward the fluorescent layer.

In one or more embodiments, the second surface of the resin layer has a substantially hemispherical shape.

In one or more embodiments, a first surface of the fluorescent layer contacts the second surface of the resin layer, and a shape of the fluorescent layer matches a shape of the second surface of the resin layer.

In one or more embodiments, the light emitting package may include a connection part surrounding the light emitting chip and may include an adhesion part (contacting and) adhering to the connection part and the circuit board.

In one or more embodiments, a first portion of the connection part is disposed between a portion of the resin layer and the circuit board, and a second portion of the connection part is disposed between a portion of the adhesion part and the circuit board.

In one or more embodiments, the adhesion part is disposed between a (transparent) portion of the fluorescent layer and the circuit board.

In one or more embodiments, the adhesion part surrounds the connection part.

One or more embodiments of the present invention may be related to a method for manufacturing a light emitting package. The method may include the following steps: mounting a light emitting chip on a circuit board; forming a fluorescent layer; after the forming step, testing one or more characteristics of the fluorescent layer; and after the testing step, placing the fluorescent over the light emitting chip.

In one or more embodiments, the method may include disposing a resin layer on the light emitting chip, wherein the fluorescent layer is disposed on the resin layer such that the resin layer is disposed between the light emitting chip and the fluorescent layer. In one or more embodiments, for a light, a refractive index of the resin layer is smaller than a refractive index of the light emitting chip and is larger than a refractive of the fluorescent layer.

In one or more embodiments, the method may include the following steps: disposing a combination of the resin layer and a connection part on the circuit board such that the resin layer covers the light emitting chip and such that the connection part surrounds the light emitting chip; and using an adhesion part to secure the connection part on the circuit board.

In one or more embodiments, a first portion of the connection part is disposed between a portion of the resin layer and the circuit board, and wherein a second portion of the connection part is disposed between a portion of the adhesion part and the circuit board.

In one or more embodiments, the adhesion part is disposed between the circuit board and a transparent portion of the fluorescent layer.

In one or more embodiments, a concave portion of the fluorescent surface matches a convex portion of the resin layer.

In one or more embodiments, each of concave portion of the fluorescent surface and the convex portion of the resin layer has a substantially hemispherical shape.

In one or more embodiments, the step of forming the fluorescent layer may include the following steps: forming a mold that includes a protrusion; disposing a transparent partition on the mold such that the transparent partition surrounds the protrusion; disposing a fluorescent material on the protrusion and within the transparent partition to form a fluorescent substance layer; and separating the mold from the fluorescent layer, the fluorescent layer including the fluorescent substance layer and the transparent partition.

In one or more embodiments, the protrusion has a substantially hemispherical surface.

In one or more embodiments, the step of testing the one or more characteristics of the fluorescent layer may include the following steps: using a light source other than the light emitting chip to emit a test light; using the fluorescent layer to transmit the test light to produce a transmitted light; and measuring a least a color-related characteristic of the transmitted light. A light emitting diode (LED) package according to one or more embodiments of the present invention may include the following elements: a circuit board; a plurality of light emitting diode (LED) chips positioned on the circuit board; a plurality of resin layers positioned on the plurality of LED chips; and a plurality of fluorescent layers positioned on the plurality of resin layers, wherein a refractive index of the plurality of resin layers is smaller than a refractive index of the LED chips and is larger than a refractive index of the plurality of fluorescent layers.

The plurality of fluorescent layers may include a transparent partition and a fluorescent substance layer positioned in a region defined by the transparent partition.

Each of the plurality of resin layers may have a substantially hemispherical shape.

A lower surface of each of the plurality of fluorescent layers may have the same substantially hemispherical recess portion as the substantially hemispherical shape of each of the plurality of resin layers.

A manufacturing method of a light emitting diode (LED) package according to one or more embodiments of the present invention may include the following steps: providing a circuit board; mounting a plurality of light emitting diode (LED) chips on the circuit board; forming a plurality of resin layers having a refractive index that is smaller than a refractive index of the LED chips on the plurality of LED chips; and attaching a plurality of fluorescent layers having a refractive index that is smaller than a refractive index of the plurality of resin layers on the plurality of resin layers.

The plurality of fluorescent layers may be formed separate from the plurality of resin layers before being attached to the plurality of resin layers. The step of forming the plurality of fluorescent layers may include the following steps: forming a mold with a substantially hemispherical shape, forming a transparent partition on the mold, forming a fluorescent substance layer in a region defined by the partition, and removing the mold.

The method may further include testing color-related characteristics of the fluorescent layer by transmitting light through the fluorescent substance layer after removing the mold and before attaching the florescent layer to the resin layer.

Each of the plurality of resin layers may be formed to have a substantially hemispherical shape.

The mold may be formed to have the same substantially hemispherical shape as each of the plurality of resin layers.

A lower surface of each of the plurality of fluorescent layer may be formed to have a recess portion of the same substantially hemispherical shape as a corresponding one of the plurality of resin layers.

According to one or more embodiments of the present invention, the intermediate refractive index of the resin layer in the refractive index arrangement may prevent significant difference(s) between refractive indexes of immediately neighboring light-transmitting media. Advantageously, light-transmitting efficiency may be maximized or preserved.

According to one or more embodiments of the present invention, the quality of the fluorescent layer may be tested before the fluorescent layer is disposed on the resin layer. Advantageously, potential defects of the light emitting package related to the quality of the fluorescent layer may be minimized or prevented.

DETAILED DESCRIPTION OF THE EMBODIMENTS

Figure 1:
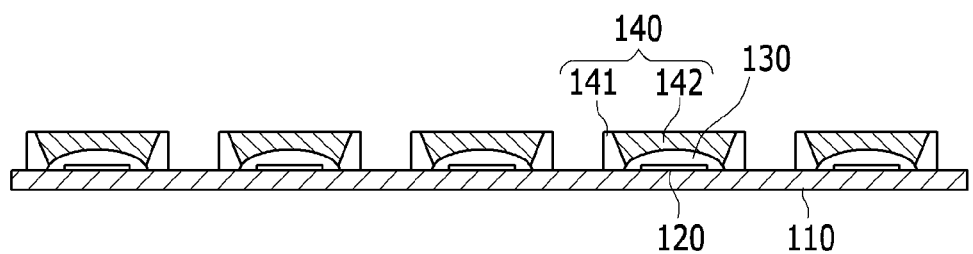
FIG. 1 is a cross-sectional view illustrating a light emitting diode (LED) package according to one or more embodiments of the present invention.

The present invention will be described more fully hereinafter with reference to the accompanying drawings, in which embodiments of the invention are illustrated. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no (intended) intervening elements (except possible environmental elements, such as air) present.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

FIG. 1 is a cross-sectional view illustrating at least a light emitting diode (LED) package according to one or more embodiments of the present invention.

Referring to FIG. 1, the LED board may include a circuit board 110 and may include a plurality of LED units. Each LED unit of the plurality of LED units may include a light emitting diode (LED) chip 120 disposed on the circuit board 110, a resin layer 130 disposed on (and/or substantially covering) the LED chip 120, and a fluorescent layer 140 disposed on (and/or substantially covering) the resin layer 130.

In one or more embodiments, each LED unit of the plurality of LED units may be construed to include a portion of the circuit board 110.

The circuit board 110 includes a circuit to drive (and/or control) the LED chips 120 of the LED units. The circuit board 110 may include a semiconductor chip integrated on a printed circuit board (PCB).

The LED chips 120 may be mounted on the circuit board 110 according to a chip on board technology and may receive power from the circuit board 110 for emitting light. In one or more embodiments, the LED chips 120 may be disposed in a matrix or array form with a predetermined interval.

Each of the LED chips 120 may emit at least one of a red light, a green light, and a blue light.

The resin layer 130 may be made of a transparent resin. The resin layer 130 may be convex with respect to the circuit board 110. The resin layer 130 may have a substantially hemispherical shape. For a particular light, the refractive index of the resin layer 130 is smaller than the refractive index of the LED chip 120 and is larger than the refractive index of the fluorescent layer 140. In one or more embodiments, the difference between the refractive index of the resin layer 130 and the refractive index of the LED chip 120 is smaller than the difference between the refractive index of the fluorescent layer 140 and the refractive index of the resin layer 130. In one or more embodiments, the refractive index of the fluorescent layer 140 is larger than the refractive index of air.

The resin layer 130, which has a refractive index that is smaller than that of the LED chip 120 and is larger than that of the fluorescent layer 140, may be disposed between the LED chip 120 and the fluorescent layer 140 to minimize or prevent a substantial efficiency reduction of the light that might be caused by the significant refractive index difference between the LED chip 120 and the fluorescent layer 140. The resin layer 130 may be formed with the substantially hemispherical shape to reflect light radiated from other LED units, thereby increasing efficiency of the light.

The fluorescent layer 140 may include a partition 141 made of a transparent resin and a fluorescent substance layer 142 disposed in a region defined by the partition 141. The fluorescent substance layer 142 may include one or more fluorescent substances. In one or more embodiments, the fluorescent substance layer 142 may be formed by depositing and hardening a mixture that includes a transparent resin and a phosphor material in the region defined by the partition 141. In one or more embodiments, the fluorescent substance layer 142 may be formed by covering a phosphor material and encapsulating the region defined by the partition 141 with a transparent resin layer. In one or more embodiments, the fluorescent layer 140 may be formed using one or more of various methods.

A lower surface of the fluorescent layer 140 may have the same shape as an upper surface of the underlying resin layer 130. The resin layer 130 may be convex toward the fluorescent layer 140. The lower surface of the fluorescent layer 140 may have a recess portion of the substantially hemispherical shape.

Each of the refractive index of the partition 141 and the refractive index of the fluorescent substance layer 142 may be smaller than the refractive index of the resin layer 130 and may be larger than the refractive index of air. Therefore, the refractive indexes of the media for transmitting light is decreased in the sequence of the LED chip 120, the resin layer 130, the fluorescent layer 140, and external air. In one or more embodiments, by gradually changing the refractive indexes of the light-transmitting media from the lower side to the upper side, the efficiency reduction caused by refractive index differences may be minimized or prevented. In general, a refraction angle for a light that progresses from a medium having a large refractive index to a medium having a small refractive index may be relatively large compared with a refraction angle for a light that progresses from a medium having a small refractive index to a medium having a large refractive index. Accordingly, in one or more embodiments, the efficiency of light transmitted in a direction perpendicular to the light source may be maximized.

The fluorescent layer 140 may be formed separately from the LED chip 120 and/or the resin layer 130 and may be attached to the resin layer 130. Accordingly, each fluorescent layer 140 may be tested for color-related characteristics, etc. before being included in an LED unit. Therefore, errors and/or defects of the LED package potentially caused by non-uniformity and/or defects of the fluorescent layers 140 may be minimized or prevented.

FIG. 2 to FIG. 9 are cross-sectional views showing illustrating steps in a method for manufacturing a LED package according to one or more embodiments of the present invention.

Figure 2:
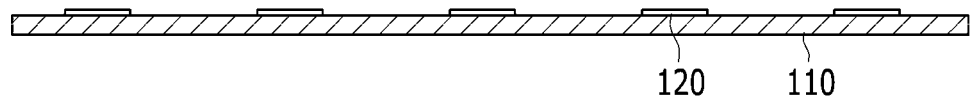
FIG. 2 to FIG. 9 are cross-sectional views illustrating steps in a method for manufacturing an LED package according to one or more embodiments of the present invention.

Referring to FIG. 2, a circuit board 110, which may include a semiconductor chip integrated on a printed circuit board (PCB), may be provided. A plurality of light emitting diode (LED) chips 120 may be mounted on the circuit board 110. In one or more embodiments, the plurality of light emitting diode (LED) chips 120 may be mounted on the circuit board 110 according to a chip on board technology and may light by receiving power from the circuit board 110. In one or more embodiments, the LED chips 120 may be formed with a matrix or array shape with a predetermined interval. Each of the LED chips 120 may emit at least one of a red light, a green light, and a blue light.

Figure 3:
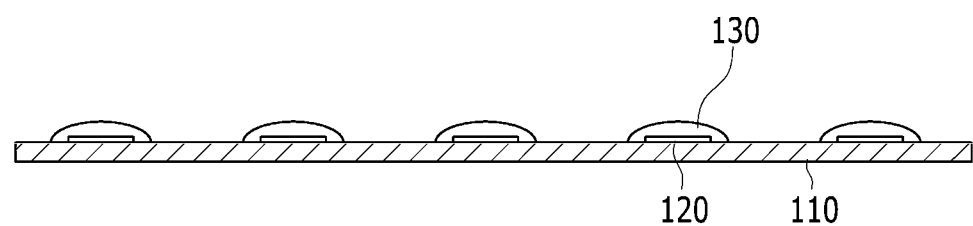

Referring to FIG. 3, a plurality of resin layers 130 are formed on the plurality of LED chips 120. The plurality of resin layers 130 may be formed by depositing a transparent resin material and then hardening the material to form the substantially hemispherical shape. In one or more embodiments, the substantially hemispherical shape may be formed using a mold with a dome shape before the resin layers 130 are attached onto the LED chips 120. The resin layers 130 are made of the transparent resin, and each resin layer 130 may have the substantially hemispherical shape. For a particular light (e.g., the light emitted by the LED chip 120), the refractive index of each resin layer 130 is smaller than the refractive index of the corresponding LED chip 120 and is larger than the refractive index of the corresponding fluorescent layer 140.

Figure 4:
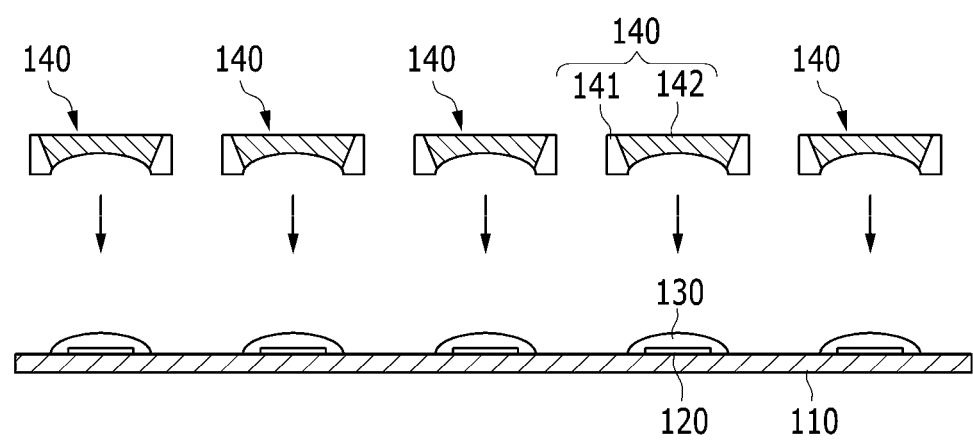

Next, referring to FIG. 4, a plurality of fluorescent layers 140 are attached to the plurality of resin layers 130. Before the fluorescent layers 140 are attached to the resin layers 130, the fluorescent layers 140 may have been tested to ensure one or more characteristics (e.g., one or more color-related characteristics) meet predetermined requirements. Each fluorescent layer 140 may include a partition 141 made of a transparent resin and a fluorescent substance layer 142 disposed in a region defined by the partition 141. The plurality of fluorescent layers 140 may be formed separately from the plurality of LED chips 120 and/or the plurality of resin layers 130 and may be attached to the plurality of resin layers 130 after a quality assurance process.

A manufacturing method of a fluorescent layer 140 will be described with reference to FIG. 5 to FIG. 9.

Figure 5:
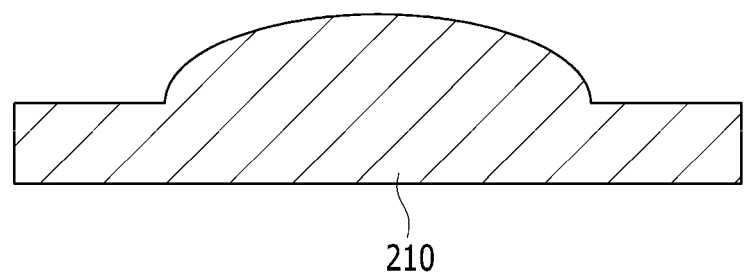

Referring to FIG. 5, a mold 210 having a substantially hemispherical shape similar to the shape of an upper surface of a resin layer 130 is manufactured.

Figure 6:
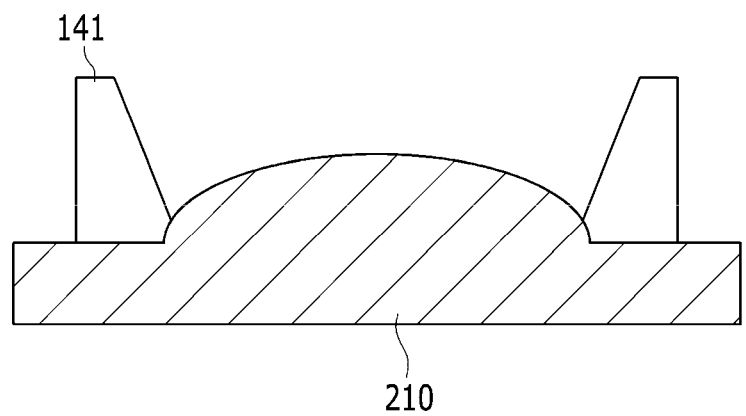

Next, as illustrated in FIG. 6, a partition 141 made of a transparent resin is formed on the mold 210.

Figure 7:
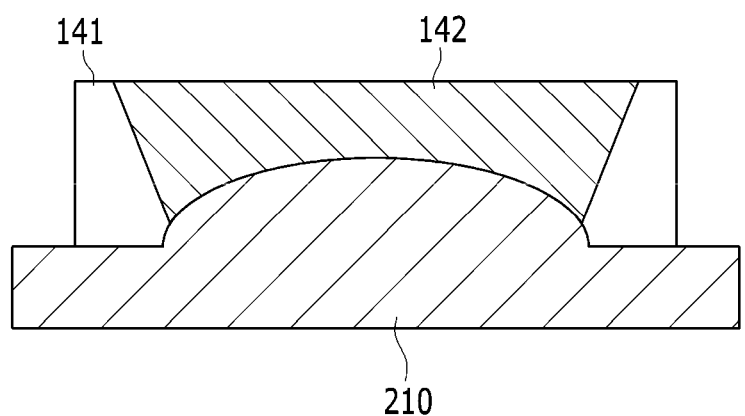

Next, as illustrated in FIG. 7, a fluorescent substance layer 142 is formed in the region defined by the partition 141. In one or more embodiments, the fluorescent substance layer 142 may be formed by depositing and hardening a mixture that includes a transparent resin and a phosphor material in the region defined by the partition 141. In one or more embodiments, the fluorescent layer 142 may be formed by covering a phosphor material and encapsulating the region defined by the partition 141 with a transparent resin layer. In one or more embodiments, the fluorescent layer 140 may be formed by various methods.

Figure 8:
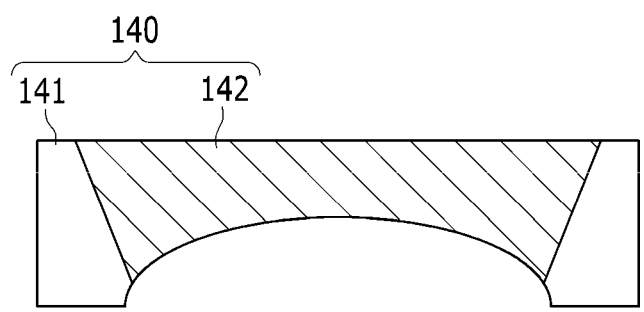

Next, as illustrated in FIG. 8, the mold 210 positioned under the fluorescent layer 140 is removed.

Figure 9:
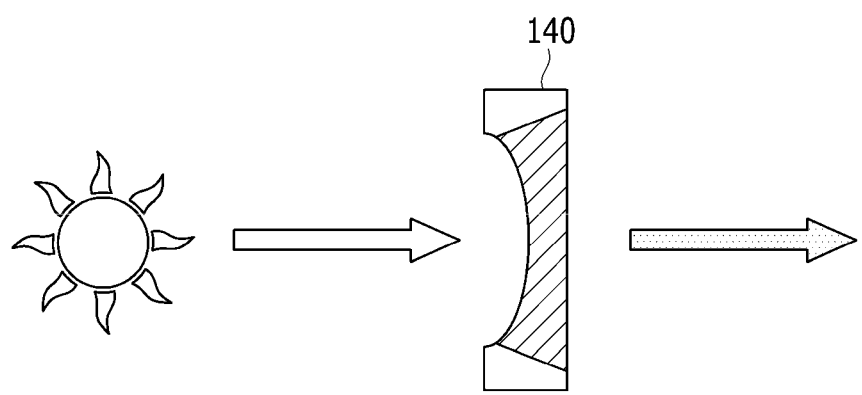

Subsequently, the quality of the fluorescent layer 140 may be tested. In one or more embodiments, as illustrated in FIG. 9, a light source other than the LED chip 120 may be used for testing color-related characteristics of the fluorescent layer 140. The color-related characteristics of the fluorescent layer 140 may be represented by values in a color coordinate system associated with a light that is transmitted from the light source through the formed fluorescent layer 140.

After the quality test, as illustrated in FIG. 4, qualified fluorescent layers 140 may be attached to resin layers 130 that cover LED chips 120. Advantageously, defects of the LED package potentially caused by non-uniform color-related characteristics of fluorescent layers 140 may be minimized or prevented.

Figure 10:
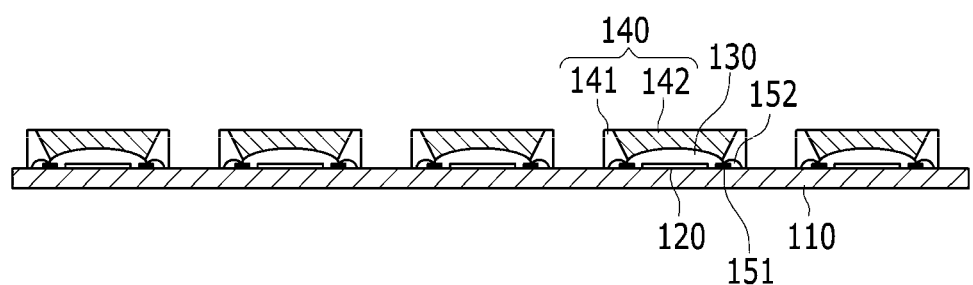
FIG. 10 is a cross-sectional view illustrating an LED package according to one or more embodiments of the present invention.

FIG. 10 is a cross-sectional view illustrating an LED package according to one or more embodiments of the present invention.

Referring to FIG. 10, some elements of the LED package according to the present exemplary embodiment may be analogous to elements of the LED package described with reference to FIG. 1. Referring to FIG. 10, the LED package may include a circuit board 110 and may include a plurality of LED units. Each LED unit of the LED units may include an LED chip 120 disposed on the circuit board 110, a resin layer 130 positioned on (and/or substantially covering) the LED chip 120, and a fluorescent layer 140 disposed on (and/or substantially covering) the resin layer 130. In one or more embodiments, each LED unit of the plurality of LED units may be construed to include a portion of the circuit board 110.

The circuit board 110 includes a circuit to drive (and/or control) the LED chips 120 of the LED units. The circuit board 110 may include a semiconductor chip integrated on a printed circuit board (PCB).

The LED chips 120 may be mounted on the circuit board 110 according to a chip on board and may receive power from the circuit board 110 for emitting light. Each of the LED chips 120 may emit at least one of a red light, a green light, and a blue light.

The resin layer 130 may be made of a transparent resin. The resin layer 130 may be convex with respect to the circuit board 110. The resin layer 130 may have a substantially hemispherical shape. For a particular light, the refractive index of the resin layer 130 is smaller than the refractive index of the LED chip 120 and is larger than the refractive index of the fluorescent layer 140.

The fluorescent layer 140 may include a partition 141 made of a transparent resin and a fluorescent substance layer 142 disposed in a region defined by the partition 141. The fluorescent substance layer 142 may include one or more fluorescent substances. In one or more embodiments, the fluorescent substance layer 142 may be formed by depositing and hardening a mixture that includes a transparent resin and a phosphor material in the region defined by the partition 141. In one or more embodiments, the fluorescent substance layer 142 may be formed by covering a phosphor material and encapsulating the region defined by the partition 141 with a transparent resin layer. In one or more embodiments, the fluorescent layer 140 may be formed using one or more of various methods.

The fluorescent layer 140 may be concave with respect to the circuit board 110. A lower surface of the fluorescent layer 140 may have the same shape as an upper surface of the underlying resin layer 130. The lower surface of the fluorescent layer 140 may match the upper surface of the underlying resin layer 130. The fluorescent layer 140 may have a recess portion of the substantially hemispherical shape. The LED chip 120 and a substantial portion of the resin layer 130 may be disposed inside the recess.

Each of the refractive index of the partition 141 and the refractive index of the fluorescent substance layer 142 may be smaller than the refractive index of the resin layer 130 and may be larger than the refractive index of air.

The fluorescent layer 140 may be formed separately from the LED chip 120 and/or the resin layer 130 and may be attached to the resin layer 130. Accordingly, each fluorescent layer 140 may be tested for color-related characteristics, etc. before being included in an LED unit. Therefore, errors and/or defects of the LED package potentially caused by non-uniformity and/or defects of the fluorescent layers 140 may be minimized or prevented.

In one or more embodiments, the LED package may further include a plurality of connection parts 151 and a plurality of adhesion parts 152, each being disposed on the circuit board 110. The connection parts 151 may mechanically connected the resin layers 130 to the circuit board 110. The adhesion parts 152 may secure the connection parts 151 on the circuit board 110 and/or may secure the fluorescent layers 140 on the circuit board 110.

Each connection part 151 may substantially surround an LED chip 120. In one or more embodiments, each connection part 151 may be simultaneously formed along with a resin layer 130 and/or may be disposed along an edge of the lower surface (i.e., bottom surface) of a resin layer 130.

Each adhesion part 152 may secure a connection part 151 on the circuit board 110. In one or more embodiments, the adhesion part 152 may be adhered to both the connection part 151 and the circuit board 110 through one or more of soldering, etc. A first portion of a connection part 151 may be disposed between a portion of a corresponding resin layer and the circuit board 110. A second portion of the connection part 151 may be disposed between a portion of a corresponding adhesion part 152 and the circuit board 110. The adhesion part 152 may be disposed between a corresponding partition 141 and the circuit board 110. In one or more embodiments, each adhesion part 152 may secure a fluorescent layer 140 on the circuit board 110.

Advantageously, the resin layers 130 and/or the fluorescent layers 140 may be secured on the circuit board 110, such that consistent and satisfactory performance of the LED package may be ensured.

FIG. 5 to FIG. 9 and FIG. 11 to FIG. 14 are cross-sectional views illustrating steps in a method for manufacturing a LED package according to one or more embodiments of the present invention.

Figure 11:
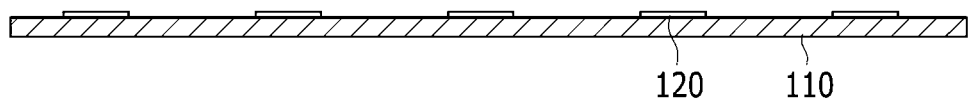
FIG. 11 to FIG. 14 are cross-sectional views illustrating steps in a method for a manufacturing an LED package according to one or more embodiments of the present invention.

Referring to FIG. 11, a circuit board 110, which may include a semiconductor chip integrated on a printed circuit board (PCB), may be provided. A plurality of light emitting diode (LED) chips 120 may be mounted on the circuit board 110. In one or more embodiments, the plurality of light emitting diode (LED) chips 120 may be mounted on the circuit board 110 according to a chip on board technology and may light by receiving power from the circuit board 110. In one or more embodiments, the LED chips 120 may be formed with a matrix or array shape with a predetermined interval. Each of the LED chips 120 may emit at least one of a red light, a green light, and a blue light.

Figure 12:
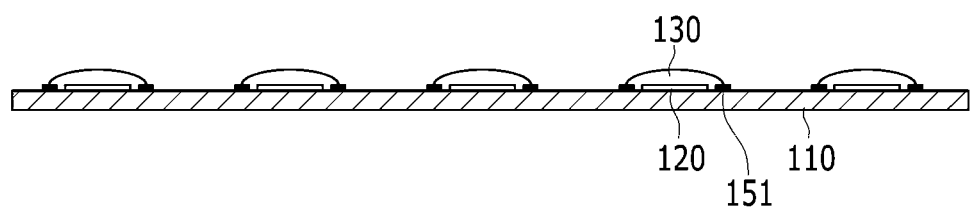

Next, referring to FIG. 12, a connection parts 151 are formed near the LED chips 120 (with each connection part 151 substantially surrounding a corresponding LED chip 120), and resin layers 130 are formed on the LED chips 120. The plurality of resin layers 130 may be formed by depositing a transparent resin material and then hardening the material to form a substantially hemispherical shape. In one or more embodiments, the substantially hemispherical shape may be formed using a mold with a dome shape before the resin layers 130 are attached onto the LED chips 120. A resin layer 130 and a connection part 151 may be combined before the combination of the resin layer 130 and the connection part is disposed on a corresponding LED chip 120.

The resin layers 130 are made of the transparent resin, and each resin layer 130 may have the substantially hemispherical shape. For a particular light (e.g., the light emitted by the LED chip 120), the refractive index of each resin layer 130 is smaller than the refractive index of the corresponding LED chip 120 and is larger than the refractive index of the corresponding fluorescent layer 140.

Figure 13:
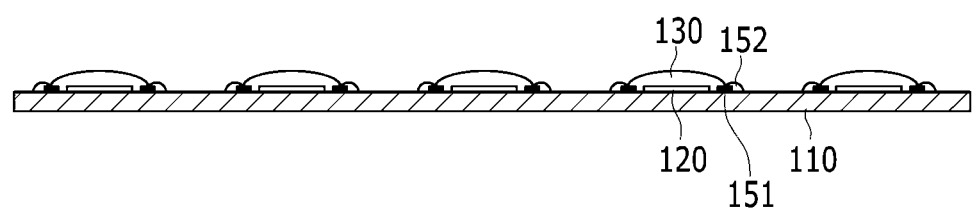

Next, referring to FIG. 13, for each LED unit, an adhesion part 152 is formed to substantially securely attach the corresponding connection part 151 (which is positioned near the corresponding LED chip 120 and may surround the LED chip 120) to the circuit board 110. The adhesion part 152 may substantially surround the correction part 151.

According to embodiments of the present invention, for each LED unit, the connection part 151 may be securely connected with the resin layer 130 and may substantially surround the LED chip 120, and the adhesion part 152 may secure the connection part 151 on the circuit board 110. Advantageously, the resin layers 130 may be secured on the circuit board 110, such that consistent and satisfactory performance of the LED unit may be ensured.

Figure 14:
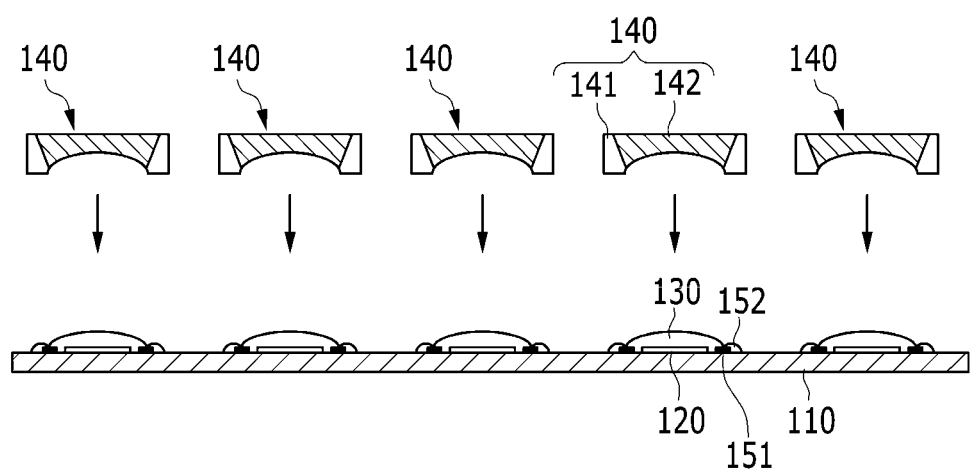
Figure 15:
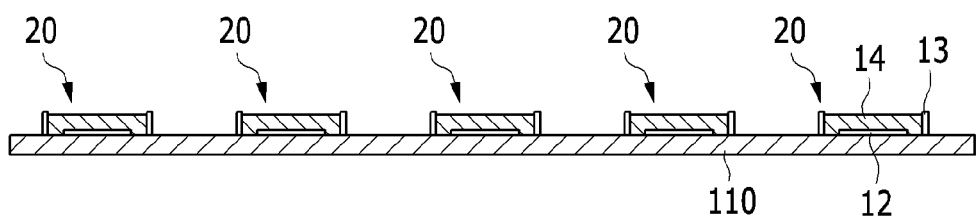
FIG. 15 is a cross-sectional view illustrating a conventional LED package.

Next, referring to FIG. 14, a plurality of fluorescent layers 140 may be attached onto the plurality of resin layers 130 (with each fluorescent layer 140 being attached to a corresponding resin layer 130). Each fluorescent layer 140 may include a partition 141 made of a transparent resin and a fluorescent substance layer 142 disposed in a region defined by the partition 141. The fluorescent layer 140 may be formed before being disposed on the corresponding LED chip 120 and/or before being attached to the corresponding resin layer 130. Each fluorescent layer 140 may be tested for color-related characteristics, etc. before being included in an LED unit. Therefore, errors and/or defects of the LED package potentially caused by non-uniformity and/or defects of the fluorescent layers 140 may be minimized or prevented.

Each fluorescent layer 140 may be manufactured and tested using a method discussed above with reference to FIG. 5, FIG. 6, FIG. 7, FIG. 8, and FIG. 9.

After the quality test, as illustrated in FIG. 14, qualified fluorescent layers 140 may be attached to resin layers 130 that cover LED chips 120. Advantageously, defects of the LED package potentially caused by non-uniform color-related characteristics of fluorescent layers 140 may be minimized or prevented. In one or more embodiments, the resin layer 130, which has a refractive index that is smaller than that of the LED chip 120 and is larger than that of the fluorescent layer 140, may be disposed between the LED chip 120 and the fluorescent layer 140 to minimize or prevent a substantial efficiency reduction of the light that might be caused by the significant refractive index difference between the LED chip 120 and the fluorescent layer 140. The resin layer 130 may be formed with the substantially hemispherical shape to reflect light radiated from other LED units, thereby increasing efficiency of the light.

While this invention has been described in connection with what is presently considered to be practical embodiments, it is to be understood that the invention is not limited to the disclosed embodiments. The invention is intended to cover various modifications and equivalent arrangements included within the spirit and scope of the appended claims.

DESCRIPTION OF SYMBOLS

20: light emitting diode (LED) unit
12: light emitting diode (LED) chip
13: partition
14: phosphor material
110: circuit board
120: light emitting diode (LED) chip
130: resin layer
140: fluorescent layer
141: partition
142: fluorescent substance layer

What is claimed is:
1. A method for manufacturing a light emitting package, the method comprising:
   mounting a light emitting chip on a circuit board;
   forming a fluorescent layer;
   after the forming, measuring a color-related characteristic of a transmitted light, wherein the transmitted light is provided from the fluorescent layer;
   after the measuring the color-related characteristic of the transmitted light, placing the fluorescent layer over the light emitting chip;
   disposing a resin layer on the light emitting chip, wherein the fluorescent layer includes a fluorescent substance layer and a transparent partition, and wherein the transparent partition surrounds and contacts both the fluorescent substance layer and the resin layer;
   disposing a combination of the resin layer and a connection part on the circuit board such that the resin layer covers the light emitting chip and such that the connection part surrounds the light emitting chip; and
   using an adhesion part to secure the connection part on the circuit board,
   wherein the fluorescent layer is disposed on the resin layer such that the resin layer is disposed between the light emitting chip and the fluorescent layer, and wherein, for a light, a refractive index of the resin layer is smaller than a refractive index of the light emitting chip and is larger than a refractive of the fluorescent layer.

2. The method of claim 1, wherein a first portion of the connection part is disposed between a portion of the resin layer and the circuit board, and wherein a second portion of the connection part is disposed between a portion of the adhesion part and the circuit board.

3. The method of claim 1, wherein the adhesion part is disposed between the circuit board and a transparent portion of the fluorescent layer.

4. The method of claim 1, wherein a concave portion of the fluorescent surface matches a convex portion of the resin layer.

5. The method of claim 4, wherein each of the concave portion of the fluorescent surface and the convex portion of the resin layer has a substantially hemispherical shape.

6. A method for manufacturing a light emitting package, the method comprising:
   mounting a light emitting chip on a circuit board;
   forming a fluorescent layer; and
   placing the fluorescent over the light emitting chip,
   wherein the forming the fluorescent layer comprises:
      forming a mold that includes a protrusion;
      disposing a transparent partition on the mold such that the transparent partition surrounds the protrusion;
      disposing a fluorescent material on the protrusion and within the transparent partition to form a fluorescent substance layer; and
      separating the mold from the fluorescent layer, the fluorescent layer including the fluorescent substance layer and the transparent partition.

7. The method of claim 6, wherein the protrusion has a substantially hemispherical surface.

8. The method of claim 1, comprising:
   using a light source other than the light emitting chip to emit a test light; and
   using the fluorescent layer to transmit the test light to produce the transmitted light.

* * * * *